United States Patent [19]
Park et al.

[11] Patent Number: 5,959,483
[45] Date of Patent: Sep. 28, 1999

[54] METHOD FOR AMPLIFYING VOLTAGE IN JOSEPHON JUNCTION

[75] Inventors: Seon Hee Park; Seung Hwan Kim; Chang Su Ryu, all of Daejon-Shi, Rep. of Korea

[73] Assignee: Electronics and Telecommunications Research Institute, Daejon, Rep. of Korea

[21] Appl. No.: 08/978,445

[22] Filed: Nov. 25, 1997

[30] Foreign Application Priority Data

Nov. 12, 1996 [KR] Rep. of Korea ................. 96-64129

[51] Int. Cl.$^6$ ..................................... H03K 3/38
[52] U.S. Cl. ...................... 327/186; 327/366; 327/367
[58] Field of Search ....................... 327/186, 366, 327/367, 369, 368; 505/190, 834

[56] References Cited

U.S. PATENT DOCUMENTS

| | | | |
|---|---|---|---|
| 5,191,236 | 3/1993 | Ruby | 505/854 |
| 5,379,999 | 1/1995 | Martens et al. | 330/295 |
| 5,629,889 | 5/1997 | Chandra et al. | 365/162 |

OTHER PUBLICATIONS

Mark M. Millonas et al., "Nonequilibrium Fluctuation–induced Phase Transport In Josephson Junctions", Physical Review E, vol. 53, No. 3, Mar. 1996, 1996, The American Physical Society, pp. 2239–2242.

*Primary Examiner*—Tuan T. Lam
*Attorney, Agent, or Firm*—Jacobson, Price, Holman & Stern, PLLC

[57] ABSTRACT

The present invention discloses a method for amplifying voltage to which a test will be given in Josephon junction having external current, and more particularly, to a method for amplifying voltage in Josephon junction in which the voltage in a simple Josephon junction having an external current can be amplified by inserting an external colored noise into the external current.

1 Claim, 2 Drawing Sheets

METHOD FOR AMPLIFYING VOLTAGE IN JOSEPHON JUNCTION

FIELD OF THE INVENTION

The present invention relates to a method for amplifying voltage in Josephon junction in which the voltage to which a test will be given can be amplified by inserting an external noise.

BACKGROUND OF THE INVENTION

A typical Josephon junction includes two separated superconductors, an insulator (called "gap") connecting them, and an external current. Electrons within superconductors are same in size and opposite directions in momentum, and they may form a stable shape when their cooper pair are consisted of two electrons having opposite spins. However, the cooper pair may break and the excited electrons or holes created due to the breakage are referred as quasi-particles.

When two superconductors are near enough, the cooper pair located at one superconductor exits the gap toward the other superconductor, and this is referred as a Josephon tunneling. Movement of the cooper pair is called a super current having no resistance. If the external current is less than a critical current, the external current appears as a super current that is movement of the cooper pairs. However, if the external current is greater than the critical current, current (called "common current") due to the tunneling of quasi-particles other than the super current is generated because the cooper pairs will break, and accordingly there exists a resistance and it will cause a voltage to occur.

SUMMARY OF THE INVENTION

The object of the present invention to provide a method for amplifying voltage in Josephon junction used for a device such as a superconductor quantum device sensing a very weak magnetic field or measuring the amount thereof, by which the voltage could be maximized by inserting color noise into the external current.

The another object of the present invention to provide a method for amplifying voltage in Josephon junction comprising the steps of determining a voltage in Josephon junction; adding a colored noise to an external current; and controlling given parameter values and the intensity of the colored noise or the flip vibration number to amplify the voltage determined in the first step.

In the present invention, an external current is applied to Josephon junction circuit having a resistance, and then a symmetric telegraph noise or a more general colored noise is applied to the external current. The voltage can be amplified by controlling the intensity of the noise and the flip vibration number.

BRIEF DESCRIPTION OF THE DRAWINGS

For fuller understanding of the nature and object of the invention, reference presents following detailed description taken in conjunction with the accompanying drawings in which.

Similar reference characters refer to similar parts in the several views of the drawings.

DESCRIPTION OF THE INVENTION

Embodiments of the present invention will be explained below in detail by reference to the accompanying drawings.

Figure 1:
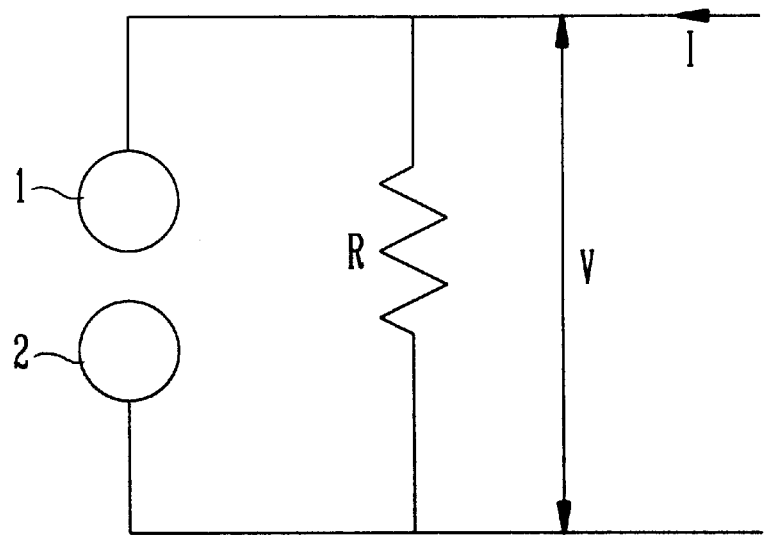
FIG. 1 is a circuit diagram to illustrate Josephon junction having an external current.

FIG. 1 is a circuit diagram to illustrate one Josephon junction. In the drawing, two circles indicate a first and a second superconductors 1 and 2 respectively. R indicates the resistance of the current due to movement of the quasi-particles. I and V indicate external current and voltage respectively.

The circuit of FIG. 1 can be represented as a differential equation such as [Mathematical Equation 1] referred as a Josephon relationship, assuming that the constants such as Planck's constant, the resistance and the charge amount of electrons are all 1.

[Mathematical Equation 1]

$$d\psi/dt = -b \sin \psi + I.$$

[Mathematical Equation 1] is obtained by resealing Planck's constant, the resistance and the charge amount of electrons from an original equation having these constants and by setting the resistance R to be 1. Where p is a phase difference between the phase of the cooper pair wave function on one superconductor that on the other superconductor. The super current due to the cooper pair is caused by the interference of the wave function at the cooper pairs located on both side superconductors.

[Mathematical Equation 1] represents the amount of common current on the left side. Where R=1, the left side in [Mathematical Equation 1] also represents the voltage. The first term on the left side in [Mathematical Equation 1] represents a super current, and the term b represents a critical current of the gap. If external current is not applied thereto (I=0), the super current and the common current both have the values of 0 since the stable fixed point of [Mathematical Equation 1] is when $\psi$=0.

In the present invention, taking Josephson junction having an external current not 0 and a color noise I(t) into considerations. For brief explanation of this invention, the simplest telegraph noise (or dichotomous noise) among the colored noises is selected for I (t). However, the results may be derived through the general colored noise. The symmetric telegraph noise I(t) has two values $\Delta$ and $-\Delta$ and it also has a specific value as in [Mathematical Equation 2].

[Mathematical Equation 2]

$$<I(t)=0>, <I(t)I(t-\tau)=\Delta^2 \exp(-\gamma \tau)$$

where <.> is the average of the noise ensemble, and $\Delta$ and $\gamma/2$ each represents the intensity of I(t) and the flip vibration number of $\Delta \rightarrow -\Delta$ (or $-\Delta \rightarrow \Delta$).

When representing the Josephon junction used in the present invention as a differential equation, it will give the following [Mathematical Equation 3].

[Mathematical Equation 3]

$$d\psi/dt = -b \sin \psi + I + I(t) + \eta(t)$$

$\eta(t)$ is an external Gaussian white noise caused by temperature variation etc. and is given as the following [Mathematical Equation 4].

[Mathematical Equation 4]

$$<\eta(t)>=0, <\eta(t)\eta(t-\tau)>=2D\delta(\tau)$$

Where <. > is the average of the noise ensemble and D is the intensity of an external noise $\eta(t)$.

The relationship between the phase difference ψ and the voltage V(t) is given as V(t)=dψ/dt. The stationary voltage v after enough long time may be calculated using the solution of the stationary probability density function in the ensemble equation derived from [Mathematical Equation 3].

That is, it will result in V=<V(t)> and <.> is the average of the stationary probability density, $P_s(\phi)$.

[Mathematical Equation 5B]

$$0=-\gamma(P_+(\phi)-P_-(\phi))+d/d\phi[(b\sin\phi-I+\Delta)P_+(\phi)+D.dP_+(\phi)/d\phi]$$

[Mathematical Equation 5B]

$$0=\gamma(P_-(\phi)-P_-(\phi))+d/d\phi[(b\sin\phi-I+\Delta)P_-(\phi)+D.dP_-(\phi)/d\phi]$$

Next, the sum of the stationary solution $P_+(100)+P_-(\phi)$ in the combined ensemble equations [Mathematical Equation 5A] and [Mathematical Equation 5B] becomes the stationary probability density function $P_s(\phi)$. That is, it will result in $P_s(\phi)=P_+(\phi)+P_-(\phi)$ and V is given as the following [Mathematical Equation 6]
[Mathematical Equation 6]

$$V=\int_0^{2\pi} d\phi(-b\sin\phi+I+\Delta)P_s(\phi)$$

where, when solving [Mathematical Equation 5A] and [Mathematical Equation 5B] so as to find $P_+(\phi)+P_-(\phi)$, a periodic boundary condition is used.

Figure 2:
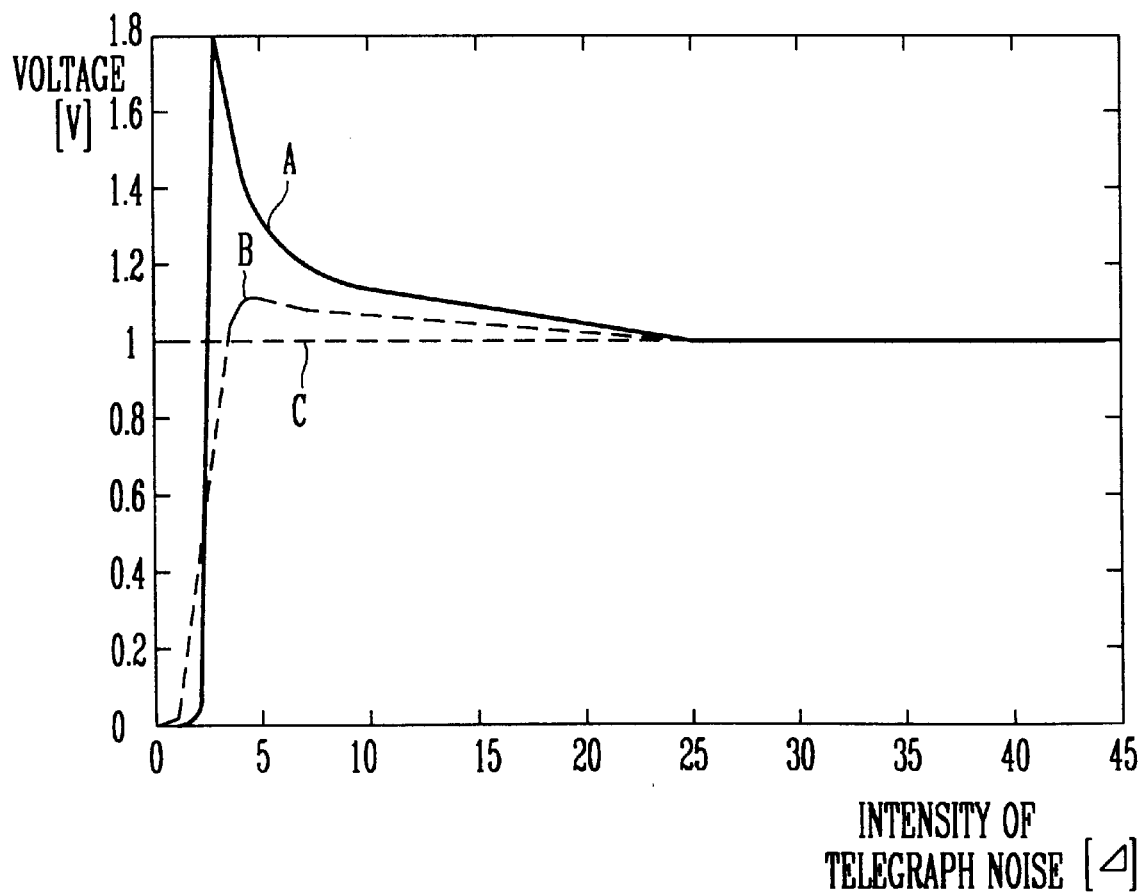
FIG. 2 is a characteristic view to illustrate a stationary voltage in accordance with telegraph noise intensity at a given telegraph noise frequency.

FIG. 2 is a characteristic view to illustrate a stationary voltage in accordance with the intensity (Δ) of the telegraph noise at the flip vibration number of given telegraph noise, showing the variation of the voltage (V) in accordance with the intensity of the telegraph noise where b=2.0, I=1.0 and D=0.25. In these parameter values, if a colored noise does not exist, V=1.

A solid line A, a wavelike line B and a dotted line C each represent the voltages V where the flip vibration number of the telegraph noise, log γ=−5.0, 0.5, 8.0. In the drawing, the solid line A and the wavelike line B have their peak values of V at Δ=2.6 and Δ=3.6, respectively. And the peak value of V is amplified more than 1 that is the value of voltage if any telegraph noise does not exist. As may be understood from FIG. 2, if the flip vibration number of the telegraph noise is small, i.e., if the telegraph noise belongs to a noise process occurring slowly, a great amplification effect can be obtained. If the flip vibration number is very large, the telegraph noise effect is offset to each other and thereby the value of V is given as 1 without any amplification effect.

Figure 3:
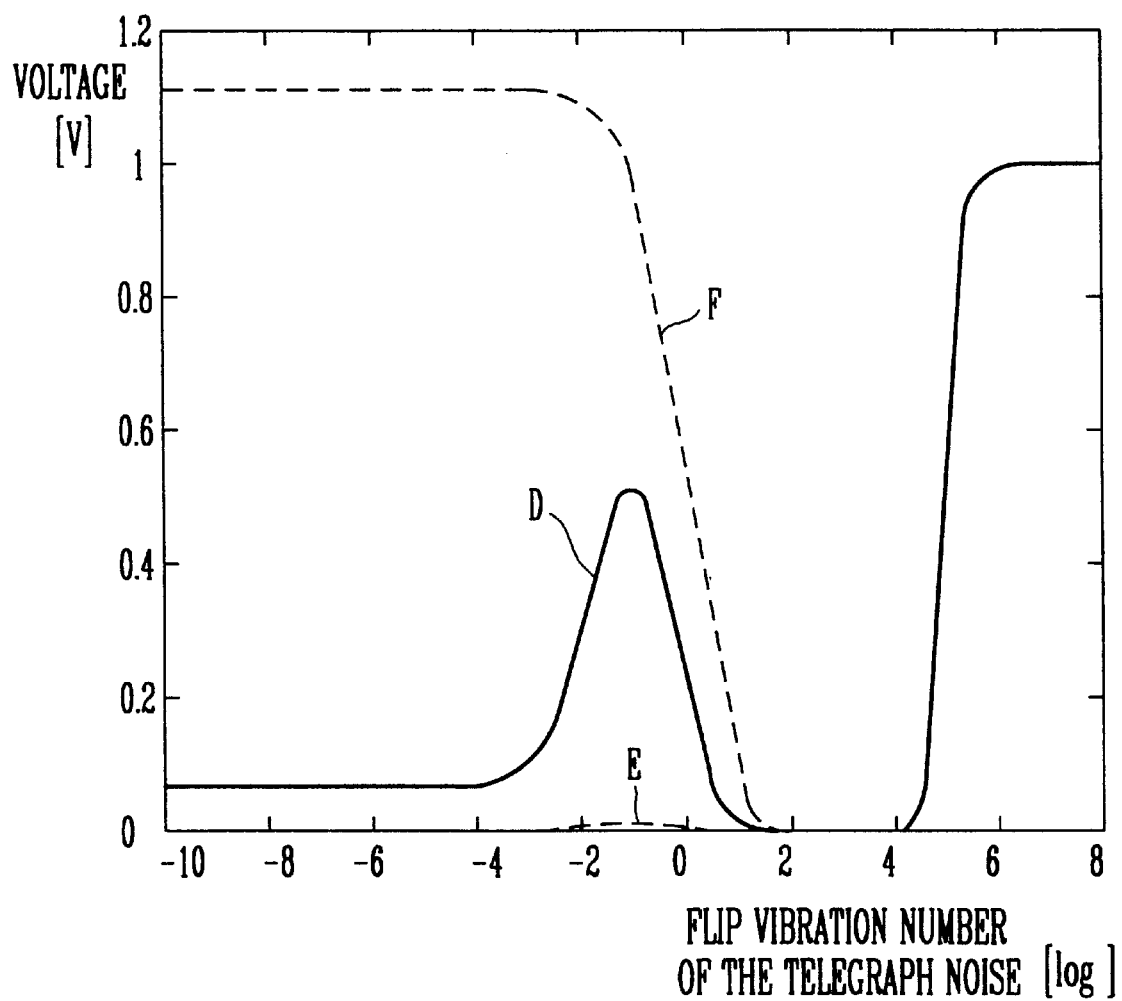
FIG. 3 is a characteristic view to illustrate a stationary voltage in accordance with the flip vibration number of the telegraph noise at a given telegraph noise intensity.

FIG. 3 is a characteristic view to illustrate a stationary voltage in accordance with the flip vibration number of the telegraph noise at the intensity of given telegraph noise, showing the variation of the voltage (V) in accordance with the flip vibration number of the telegraph noise γ where b=2.0, I=1.0 and D=0.25. A solid line D, a wavelike line E and a dotted line F each show the voltages V where Δ=1.4, 0.4 and 2.0. When Δ<b, that is, if the intensity of the telegraph noise is small, there is no amplifying effect because the value of the peak voltage V is less than 1. When Δ>b,. voltage V is amplified at a small flip vibration number. The dotted line F of FIG. 3 shows V>1 where log γ<−0.7. That is, if the intensity of the telegraph noise is large and also the noise process occurs slowly, the value of the voltage V is amplified.

As discussed earlier, the present invention has an outstanding effect of improving the commercialization and the efficiency in the manufacture of the device using Josephon junction in which the voltage can be maximized by adding a colored noise to the external current.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method for amplifying a voltage in Josephson junction comprising the steps of:

determining a voltage in Josephson junction;

adding a symmetric colored noise to a nonzero external current; and controlling given parameter values and the intensity of the colored noise or the flip vibration number to amplify the voltage determined in the first step.

* * * * *